United States Patent [19]
Carter

[11] Patent Number: 4,701,619
[45] Date of Patent: Oct. 20, 1987

[54] PYROELECTRIC DETECTORS

[75] Inventor: Christopher F. Carter, Wootton, England

[73] Assignee: Plessey Overseas Limited, Ilford, England

[21] Appl. No.: 842,590

[22] Filed: Mar. 21, 1986

[30] Foreign Application Priority Data

Mar. 23, 1985 [GB] United Kingdom ............... 8507632

[51] Int. Cl.$^4$ ............................................... G01J 5/10
[52] U.S. Cl. ..................................... 250/338; 250/349
[58] Field of Search ................. 250/338 PY, 349, 342

[56] References Cited

U.S. PATENT DOCUMENTS 3,453,432 7/1969 McHenry ................... 250/338 PY

Primary Examiner—Carolyn E. Fields
Attorney, Agent, or Firm—Michael F. Oglo; Julian C. Renfro

[57] ABSTRACT

A pyroelectric detector element having defined on a major surface two spaced areas exhibiting radiation absorbing and/or reflecting properties. A mirror-like area comprising a dielectric material is provided in at least part of the space, and preferably extends over all or substantially all of the space, defined between the two spaced areas to reflect the radiation and provide a substantially nil output contribution for the radiation falling on the space.

9 Claims, 2 Drawing Figures

PYROELECTRIC DETECTORS

BACKGROUND OF THE INVENTION

The present invention relates to pyroelectric detectors, particularly but not exclusively in their application to detecting and classifying moving bodies.

Single element pyroelectric detectors may be used in large quantities in applications such as intruder alarms, fire alarms and monitoring the movement of vehicles.

A simple pyroelectric infra-red detector is formed from a slice of pyroelectric material with metal electrodes on opposite faces and with its polar axis perpendicular to the electrodes. At constant temperature, the spontaneous polarization is compensated for by surface charges which accumulate via leakage paths between the two faces. If the temperature of the pyroelectric material is changed the spontaneous polarization changes in proportion to the pyroelectric co-efficient. The change in polarization appears as a charge on the electrodes.

A common requirement for infra-red detectors is to respond to the movement of a body, for example the movement of a person or vehicle, perhaps many metres away. The incident radiation from such a source may produce a change in temperature at the detector as low as $10^{-6}$° C. resulting in the generation of a charge of perhaps as low as $10^{-16}$ coulombs on a capacitance of 10 pF. In order to detect these very small changes, low noise high impedance amplifiers must be employed, such as for example a JFET source follower.

If a detector is used in an environment where the ambient temperature is fluctuating or the background temperature which the detector is viewing is not stable, then large unwanted 'noise' signals will be produced. In order to overcome this problem, compensated detector configurations have been developed.

Compensation may be obtained for example by connecting two oppositely polarized detector elements either in series or in parallel (the two elements should be of equal area if connected in parallel) but having one element absorbing and another element reflecting to the infra-red radiation to be detected. Since environmental changes affect both elements alike, the signals from the two elements cancel each other and no output is observed. Greater efficiency may be obtained where a moving target is viewed by arranging the system so that the image moves from one element to the other.

In a known monolithic compensated pyroelectric detector element structure different spaced metallised areas used as electrodes may be made absorbing or reflecting according to the particular application required. For many applications a null output is required for radiation falling on the unmetallised areas of the pyroelectric material; this is unlikely to be achieved owing to partial heat absorption in the pyroelectric material which will be sensed by the detectors. The deposition of an isolated reflecting metallisation of, for example, gold or aluminium in the space between the electrodes may sometimes be undesirable since an unwanted capacitance to ground is thereby generated so degrading the detector performance. The present invention seeks to overcome these problems.

SUMMARY OF THE INVENTION

According to the present invention there is provided a pyroelectric detector element, the body of which has defined on its surface at least two spaced areas exhibiting absorbing and/or reflecting properties to radiation to be detected, wherein the improvement lies in the element having a mirror-like area comprising a dielectric material in at least part of the space defined between said spaced areas.

In a preferred embodiment according to the present invention the mirror-like area extends over all or substantially all space defined between said at least two spaced areas.

In one embodiment of the present invention there is provided a pyroelectric detector element comprising a slab of pyroelectric material on a surface of which is defined at least two spaced areas each of which exhibits either absorbing or reflecting properties to radiation to be detected, each area being adapted to serve as a respective electrode, a further electrode being provided on the slab at a location opposite or adjacent to the respective electrodes, the improvement being the provision of a mirror-like area comprising a dielectric material in at least part of the space defined between the respective electrodes.

The mirror-like area may comprise a thin deposition of the dielectric material, the dielectric material having a higher refractive index that that of the pyroelectric material. Alternatively in a preferred embodiment the mirror-like area comprises a mutlilayered deposition of dielectric films of refractive index and thickness dependent on the wavelength of the radiation to be reflected. The thickness of the multilayered deposition may conveniently be set approximately equal to one quarter of the wavelength of the radiation to be reflected.

In one embodiment the multilayered deposition comprises alternate layers of thorium fluoride and zinc sulphide, and in a preferred embodiment comprises alternate layers of thorium fluoride and zinc selenide the refractive index between adjacent layers being substantially 1.7.

BRIEF DESCRIPTION OF THE DRAWINGS

The invention will be described further, by way of example, with reference to the accompanying drawing in which.

DESCRIPTION OF PREFERRED EMBODIMENTS

Figure 1:
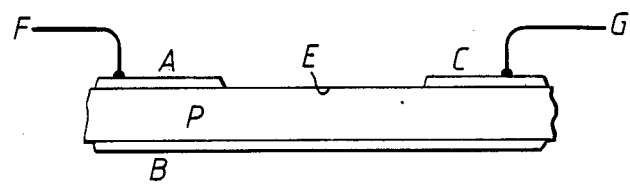
FIG. 1 shows a typical conventional configuration for a compensating detector element.

The conventional detector in FIG. 1 shows a slab of pyroelectric material P which would normally be mounted in a suitable encapsulation (not shown). In this example two radiation "sensitive" areas A and C on one major face of the slab are connected in series opposition; the "sensitive" areas are metallised, typically with gold, to provide two electrodes for two detector cells. The two detector cells are effectively defined by the capacitors formed between each of the separate metallisations A and C and a metallisation B on the opposite major face of the slab P which defines another electrode. Electrical output may be obtained between a pair of attached wires F and G. Each of the metallisations A and C may be either absorbing or reflecting according to the application whilst the slab P may be part of a larger structure or array.

In use an optical system will focus the thermal image of a target, such as a vehicle, onto the plane of the element and the detector electrical output will give information about the relative movement of the target.

Figure 2:
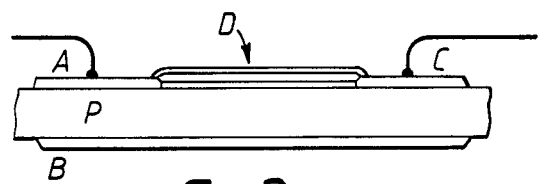
FIG. 2 shows how the element of FIG. 1 may be improved according to one embodiment of the present invention.

In many applications a null output is required for radiation falling on the unmetallised area E; this is unlikely to be achieved owing to partial heat absorption in the pyroelectric material P which will be sensed by detectors A-B or C-B. The deposition of an isolated reflecting metallisation at point D is unacceptable since parasitic capacitors will be formed to A, B and C, so degrading performance. The embodiment shown in FIG. 2 overcomes these problems by forming a mirror on the active pyroelectric material. The methods of creating such a mirror include:

(a) A thin deposition of a dielectric material, such as germanium (refractive index n=4), of higher refractive index n than the pyroelectric material P which is typically a modified lead zirconate; this alone gives a reflectance $(n-1)^2/(n+1)^2$.

(b) Multilayer deposition of dielectric films of refractive index and thickness chosen to maximise reflection for particular wavelength ranges. In one embodiment of the present invention the multilayered deposition consists of alternate layers of thorium fluoride and zinc sulphide, and typically eight layers may make up the deposition. The optical thickness of the multi layered deposition is advantageously equal to the wavelength of the radiation to be reflected divided by 4, that is $\lambda/4$.

In one embodiment the refractive index between alternative layers is substantially 1.7 the alternate layers of the deposition consisting of zinc selenide and thorium fluoride respectively.

The geometrical extent of such films on the surface of the pyroelectric may be controlled by the known techniques or microlithography. The method known as "lift off" will be found to be particularly suitable since many dielectrics are resistance to etches.

Although the present invention has been described with respect to a particular embodiment, it should be understood that modifications may be effected within the scope of the invention. For example, whereas in the embodiment described above the electrode B is formed on the opposite major face of the pyroelectric slab P to that of the electrodes A and C, in another embodiment the electrode B is formed on an adjacent side face of the pyroelectric slab P. Similarly the electrodes A and C may be formed on an adjacent side face with the electrode B being formed on one or other of the major faces of the pyroelectric slab P.

I claim:

1. A pyroelectric detector element the body of which has defined on its surface at least two spaced areas exhibiting absorbing or reflecting properties to radiation to be detected, wherein the improvement lies in the element having a mirror-like area comprising a dielectric material in at least part of the space defined between said spaced areas.

2. A pyroelectric detector as claimed in claim 1 wherein the mirror-like area extends over substantially all the space defined between said spaced areas.

3. A pyroelectric detector element as claimed in claim 1 wherein the mirror-like area comprises a thin deposition of the dielectric material, the dielectric material having a higher refractive index than that of the pyroelectric material.

4. A pyroelectric detector element as claimed in claim 1 wherein the mirror-like area comprises a multilayer deposition of dielectric films of refractive index and thickness dependent on the wavelength of the radiation to be reflected.

5. A pyroelectric detector element as claimed in claim 4 wherein the multilayered deposition has a thickness approximately equal to one quarter of the wavelength of the radiation to be reflected.

6. A pyroelectric detector element as claimed in claim 4 wherein the multilayered deposition comprises alternate layers of thorium fluoride and zinc sulphide.

7. A pyroelectric detector element as claimed in claim 4 wherein the multilayered deposition comprises alternate layers of thorium fluoride and zinc selenide.

8. A pyroelectric detector element as claimed in claim 7 wherein the refractive index between adjacent layers is substantially 1.7.

9. A pyroelectric detector element comprising a slab of pyroelectric material on a surface of which is defined at least two spaced areas each of which exhibits either absorbing or reflecting properties to radiation to be detected, each area serving as a respective electrode, a further electrode being provided on the slab at a location opposite to said respective electrodes, wherein the improvement lies in the provision of a mirror-like area comprising a dielectric material in at least part of the space defined between said respective electrodes.

* * * * *